(12) United States Patent
Choi et al.

(10) Patent No.: US 11,700,463 B2
(45) Date of Patent: Jul. 11, 2023

(54) IMAGE SENSOR AND METHOD OF MANUFACTURING SAME

(71) Applicant: DB HiTek Co., Ltd., Seoul (KR)

(72) Inventors: Woo-Sung Choi, Cheongju-si (KR); Man-Lyun Ha, Mungyeong-si (KR); Ju-Il Lee, Seongnam-si (KR)

(73) Assignee: DB HiTek, Co., Ltd., Seoul (KR)

( * ) Notice: Subject to any disclaimer, the term of this patent is extended or adjusted under 35 U.S.C. 154(b) by 354 days.

(21) Appl. No.: 16/872,041

(22) Filed: May 11, 2020

(65) Prior Publication Data

US 2020/0366857 A1 Nov. 19, 2020

(30) Foreign Application Priority Data

May 13, 2019 (KR) .................. 10-2019-0055434

(51) Int. Cl.
*H04N 5/355* (2011.01)
*H01L 27/146* (2006.01)

(52) U.S. Cl.
CPC ..... *H04N 5/3559* (2013.01); *H01L 27/14609* (2013.01); *H01L 27/14621* (2013.01); *H01L 27/14623* (2013.01); *H01L 27/14627* (2013.01)

(58) Field of Classification Search
CPC ............ H04N 5/3559; H01L 27/14609; H01L 27/14621; H01L 27/14623; H01L 27/14627; H01L 27/14685; H01L 27/14603; H01L 27/14612; H01L 27/14636; H01L 27/14683
See application file for complete search history.

(56) References Cited

U.S. PATENT DOCUMENTS

| 8,860,862 | B2 * | 10/2014 | Kobayashi | ............. | H04N 5/374 |
| | | | | | 348/308 |
| 2009/0050945 | A1 * | 2/2009 | Inoue | ................ | H01L 27/14612 |
| | | | | | 257/292 |
| 2018/0033809 | A1 * | 2/2018 | Tayanaka | ................ | H04N 5/374 |
| 2018/0122852 | A1 * | 5/2018 | Nishimura | ........ | H01L 27/14623 |

FOREIGN PATENT DOCUMENTS

KR 100849509 B1 7/2008

* cited by examiner

*Primary Examiner* — Gevell V Selby
(74) *Attorney, Agent, or Firm* — Andrew D. Fortney; Central California IP Group, P.C.

(57) ABSTRACT

An image sensor having a shield including, for example, a metal, is above an electrical charge storage element in a pixel region to block light incident toward the electrical charge storage element, thereby making it possible to reduce or prevent reading a charge value including leakage charge introduced to the electrical charge storage element, and thus adversely affecting an image result.

13 Claims, 15 Drawing Sheets

IMAGE SENSOR AND METHOD OF MANUFACTURING SAME

CROSS REFERENCE TO RELATED APPLICATION

The present application claims priority to Korean Patent Application No. 10-2019-0055434, filed May 13, 2019, the entire contents of which are incorporated herein for all purposes by this reference.

BACKGROUND OF THE INVENTION

Field of the Invention

The present invention relates generally to an image sensor. More particularly, the present invention relates to an image sensor, wherein a shield comprising, for example, a metal, is above an electrical charge storage element in a pixel region to block light incident toward the electrical charge storage element, thereby making it possible to reduce or prevent reading a charge value including leakage charge introduced into the electrical charge storage element and thus adversely affecting an image result.

Description of the Related Art

An image sensor is a device that converts an optical image originating from a subject into an electrical signal. An image sensor that generates an image by electrically converting light incident on a lens in an imaging device may be categorized into a charge-coupled device (CCD) and a complementary metal oxide semiconductor (CMOS) device. Such image sensors are configured to maintain an appropriate exposure by a shutter operation that controls the amount of light by starting and ending an exposure. A shutter for controlling the amount of light is generally categorized into a rolling shutter and a global shutter, depending on the operation method.

In the case of the rolling shutter method, a signal photoelectrically converted by optical elements (e.g., photodiodes) in each row in one frame is transferred to a floating diffusion region by sequentially selecting one row at a time, and then an image signal from a corresponding pixel is output.

On the contrary, in the case of the global shutter method, the entire signal photoelectrically converted by all optical elements in one frame is transmitted to the floating diffusion region simultaneously, and then an image signal from a corresponding pixel is output from a sequentially selected row.

FIG. 1 is a cross-sectional view illustrating a unit pixel region of an image sensor in the related art. Hereinafter, a structure and a problem of a general global shutter image sensor 9 will be described in detail with reference to FIG. 1.

Referring to FIG. 1, when an exposure of a photodiode 910 is first started, the photodiode 910 converts incident light into an electrical charge and accumulates the electrical charge. Thereafter, a first gate 920 is turned on in response to a first control signal, and the electrical charge accumulated in the photodiode 910 is transferred to a first floating diffusion region 930 and is temporarily stored there. The first control signal is turned off thereafter, and after a predetermined time elapses, a second gate 940 is turned on in response to a second control signal, and the electrical charge stored in the first floating diffusion region 930 is transferred to a second floating diffusion region 950. The second floating diffusion region 950 is then read, and the corresponding output signal is based on the electrical charge stored in the first floating diffusion region 930.

Leakage charge may be unintentionally introduced to the first floating diffusion region 930 due to diffraction and diffuse reflection of the incident light on the photodiode 910. Furthermore, the amount of leakage charge introduced to the first floating diffusion region 930 for each unit pixel may increase substantially in proportion to the readout time. Therefore, the amount of leakage charge introduced to the first floating diffusion region 930 increases as the readout time increases. Furthermore, when the second floating diffusion region 950 is read in a readout operation, the total charge value, including the leakage charge introduced to the first floating diffusion region 930, is read out. This may adversely affect the parasitic light sensitivity (PLS) characteristic of the global shutter image sensor due to unintentional light information reception and readout.

In an effort to solve this problem, the present invention relates to a novel image sensor including a shield, which may haves any of various shapes, configured to block light that might otherwise impinge upon an electrical charge storage element.

The foregoing is intended merely to aid in the understanding of the background of the present invention, and is not intended to mean that the present invention falls within the purview of the related art that is already known to those skilled in the art.

SUMMARY OF THE INVENTION

Accordingly, the present invention has been made keeping in mind the above problem(s) occurring in the related art, and an objective of the present invention is to provide an image sensor including a shield comprising, for example, a metal above an electrical charge storage element to block light incident on the electrical charge storage element or an area above the electrical charge storage element, thereby making it possible to reduce or prevent reading a total charge value including leakage charge introduced to a corresponding electrical charge storage element from a floating diffusion region and thus adversely affecting the parasitic light sensitivity (PLS) characteristic (e.g., of the image sensor).

Another objective of the present invention is to provide an image sensor including a shield that includes one or more side walls extending upwardly, for example, substantially vertically from, for example, a semiconductor layer of the image sensor, and an overlying layer extending, for example, substantially horizontally from an uppermost surface of the side wall(s), thereby making it possible to cover the entire upper surface of the electrical charge storage element.

Still another objective of the present invention is to provide an image sensor including side wall(s) as described above, spaced apart from a storage gate or semiconductor layer (or insulating layer) without being in surface contact therewith, thereby making it possible to reduce dark current or an occurrence thereof.

Yet another objective of the present invention is to provide an image sensor including a shield configured to cover the area above the storage gate as well as the electrical charge storage element, thereby making it possible to prevent incident light from being introduced to the electrical charge storage element (e.g., through the storage gate).

Still another objective of the present invention is to provide an image sensor having an overlying layer that extends outwardly farther than lateral outermost edges of the uppermost surface of the side wall(s), thereby making it possible to prevent a gap between the side wall(s) and the overlying layer due to a process error.

Still another objective of the present invention is to provide an image sensor including a wall structure instead of the side wall(s) of the shield, thereby simplifying the manufacturing process and a providing more reliable shielding function.

Still another objective of the present invention is to provide an image sensor including and overlying layer on the wall structure that partially or totally covers the area above a storage gate, thereby making it possible to partially or totally block light that may otherwise impinge upon the electrical charge storage element.

Still another objective of the present invention is to provide an image sensor including an insulating layer comprising a multilayer film to provide reliable insulation between the semiconductor layer and components thereabove.

In order to achieve the above objectives, the present invention can be implemented by one or more embodiments having the following configuration.

According to one or more embodiments of the present invention, there is provided an image sensor including a semiconductor layer including a photoelectric transformation element and an electrical charge storage element therein; a storage gate on the semiconductor layer; an upper insulating film on the semiconductor layer; a color filter on the upper insulating film in a pixel region; a lens on the color filter, focusing incident light on the photoelectric transformation element in a corresponding pixel; and a shield at least partially in the upper insulating film and above the electrical charge storage element, configured to block light that might otherwise impinge upon the electrical charge storage element or an area above the electrical charge storage element.

According to one or more other embodiments of the present invention, the shield in the image sensor according to the present invention may include one or more side walls extending vertically from the semiconductor layer, above the electrical charge storage element; and an overlying layer above the side wall(s) to block incident light.

According to still other embodiments of the present invention, the side wall(s) in the image sensor according to the present invention may surround an upper surface of the electrical charge storage element or the area above the upper surface of the electrical charge storage element.

According to still other embodiments of the present invention, the side wall(s) in the image sensor according to the present invention may have a substantially polygonal shape (e.g., in a cross-section in a plane parallel with the uppermost surface of the substrate).

According to still other embodiments of the present invention, the overlying layer in the image sensor according to the present invention may contact an uppermost end of the side wall(s) to cover an uppermost surface of the side wall(s), and the overlying layer may extend outwardly farther than outermost portions of the uppermost surface of the side wall(s).

According to still other embodiments of the present invention, the overlying layer in the image sensor according to the present invention may extend substantially horizontally in a plane above the uppermost end of the side wall.

According to still other embodiments of the present invention, there is provided an image sensor including a semiconductor layer including a photoelectric transformation element and an electrical charge storage element therein; a storage gate on the semiconductor layer; an insulating layer on an upper surface of the semiconductor layer; an upper insulating film on the insulating layer; a color filter on the upper insulating film in a pixel region; a lens on the color filter, focusing incident light on the photoelectric transformation element in a corresponding pixel; and a shield including a substantially vertical extension and a substantially horizontal extension in the upper insulating film, configured to block light that might otherwise impinge upon the electrical charge storage element or an area above the electrical charge storage element.

According to still other embodiments of the present invention, the shield in the image sensor according to the present invention may include one or more side walls extending substantially vertically (e.g., from or in the upper insulating layer), above the electrical charge storage element; and an overlying layer above the side wall(s) and extending substantially horizontally to block incident light.

According to still other embodiments of the present invention, the insulating layer in the image sensor according to the present invention may include a multilayer film comprising an oxide film (e.g., silicon dioxide), a nitride film (e.g., silicon nitride), and optionally an oxynitride film (e.g., a silicon oxynitride).

According to still other embodiments of the present invention, the side wall(s) in the image sensor according to the present invention may include a first side wall extending along or adjacent to an outer vertical surface of the storage gate adjacent to the electrical charge storage element (e.g., within a unit pixel region); and a second side wall extending along or adjacent to a boundary of the electrical charge storage element distal or remote from the storage gate, (e.g., within the unit pixel region).

According to still other embodiments of the present invention, the side wall(s) in the image sensor according to the present invention may include a first side wall extending above and along the storage gate; and a second side wall extending along the first direction at or adjacent to a boundary of the electrical charge storage element distal or remote from the storage gate (e.g., within the unit pixel region).

According to still other embodiments of the present invention, the shield in the image sensor according to the present invention may cover both the electrical charge storage element and the storage gate.

According to still other embodiments of the present invention, the side wall(s) in the image sensor according to the present invention may include a first side wall extending along a position adjacent to an outer vertical surface of the storage gate distal or remote from the electrical charge storage element (e.g., within the unit pixel region; and a second side wall extending along or adjacent to a boundary of the electrical charge storage element distal or remote from the storage gate (e.g., within the unit pixel region).

According to still other embodiments of the present invention, there is an image sensor including a semiconductor layer including a photoelectric transformation element and an electrical charge storage element therein; a storage gate on the semiconductor layer; an upper insulating film on the semiconductor layer; a color filter on the upper insulating film in a pixel region; a lens on the color filter; and a shield at least partially in the upper insulating film and above the electrical charge storage element, configured to block light that might otherwise impinge upon the electrical charge storage element or an area above the electrical charge storage element, wherein the shield includes a wall structure covering an entire upper surface of the electrical charge storage element.

According to still other embodiments of the present invention, the shield in the image sensor according to the present invention may further include a overlying layer extending horizontally on an uppermost surface of the wall structure, wherein the overlying layer may extend to partially or totally cover an area above the storage gate (e.g., in a unit pixel region).

According to still other embodiments of the present invention, there is provided a method of manufacturing an image sensor, the method including forming a photoelectric transformation element and an electrical charge storage element in a semiconductor layer; forming a storage gate on the semiconductor layer; depositing an insulating layer on an upper surface of the semiconductor layer and an outer surface of the storage gate; depositing a first insulating film on the insulating layer to a first height; forming a hole or trench in the first insulating film; forming one or more side walls or a wall structure by filling the hole or trench with a metal; forming an overlying layer on the first insulating film; and depositing a second insulating film on the first insulating film and the overlying layer to a second height.

According to still other embodiments of the present invention, in the method according to the present invention, forming the overlying layer may include depositing a sacrificial layer on the first insulating film (immediately) after forming the side wall(s) or the wall structure; etching an exposed part of the sacrificial layer, the exposed part corresponding to a location of the overlying layer; and filling an etched part of the sacrificial layer with the metal.

According to still other embodiments of the present invention, in the method according to the present invention, forming the overlying layer may include etching the exposed part of the sacrificial layer where the overlying layer is formed to a depth less than a thickness of the sacrificial layer, thereby forming an overlying layer that is not in contact with the side wall(s) or the wall structure located therebelow.

According to still other embodiments of the present invention, in the method according to the present invention, forming the overlying layer may comprise forming the metal on the first insulating film, then etching the metal, thereby forming the overlying layer.

The present invention has the following effects by the above configuration.

The shield comprising, for example, a metal is above the electrical charge storage element and is configured to block light incident on the electrical charge storage element or the area above the electrical charge storage element, and thus the present invention may prevent reading from a floating diffusion region leakage charge in a corresponding electrical charge storage element, and thus adversely affecting the parasitic light sensitivity (PLS) characteristic.

Furthermore, the shield includes side wall(s) extending upwardly, for example, substantially vertically from the semiconductor layer, and the overlying layer extending, for example, substantially horizontally from an uppermost surface of the side wall(s). Thus, the present invention may cover the entire electrical charge storage element or upper surface thereof.

Furthermore, the side wall(s) described above allow the overlying layer to be spaced apart from the storage gate and/or the semiconductor layer (or insulating layer thereon) without being in surface contact therewith, and thus the present invention may reduce dark current.

Furthermore, the shield may be configured to cover the area above the electrical charge storage element as well as the storage gate, and thus, the present invention may prevent incident light from being introduced to the electrical charge storage element through the storage gate.

Furthermore, the overlying layer may be configured such that opposite ends thereof extend outwardly farther than the lateral outermost edges of the uppermost surface of the side wall(s), and thus, the present invention may prevent a gap from forming between the side wall(s) and the overlying layer due to a process error.

Furthermore, when the wall structure is provided instead of the side wall(s) in the shield, the present invention may provide convenience in manufacturing and a more reliable shielding function.

Furthermore, the overlying layer on the wall structure enables partial or total coverage of an area above the storage gate, and thus, the present invention may partially or totally block a travel route of light that may impinge on the electrical charge storage element.

Furthermore, the insulating layer may comprise a multi-layer film to provide reliable insulation between the semiconductor layer and components thereabove.

Meanwhile, unless explicitly stated otherwise herein, the following effects disclosed in this specification and their potential effects, all of which are expected or realized from the technical features of the present invention, are considered to be disclosed in the detailed description of the present invention.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

Hereinafter, exemplary embodiments of the present invention will be described in more detail with reference to the accompanying drawings. It should be understood that the disclosed embodiments of the present invention may represent a variety of embodiments, and the scope and spirit of the present invention are not limited to the embodiments described hereinbelow. Therefore, the scope of the invention should be determined on the basis of the appended claims. Additionally, the embodiments of the present invention described hereinbelow are merely representative for purposes of allowing those skilled in the art to more clearly comprehend the present invention.

In the following description of various embodiments, it will be understood that when one element is referred to as being "on", "over", "above", or "upper" another element, it can be directly on a surface of the other element, spaced apart from the other element (e.g., indirectly "on" or "above" the other element). Additionally, when an element is spaced apart from another element, intervening elements may also be present therebetween. Additionally, when an element is disposed "directly on" or "directly over" another element, there are no intervening elements present therebetween.

Meanwhile, when an embodiment can be implemented differently, steps or operations described in the present specification may be performed in a different way from those described. For example, two consecutive functions or operations may be performed simultaneously, or in reverse order.

Figure 2:
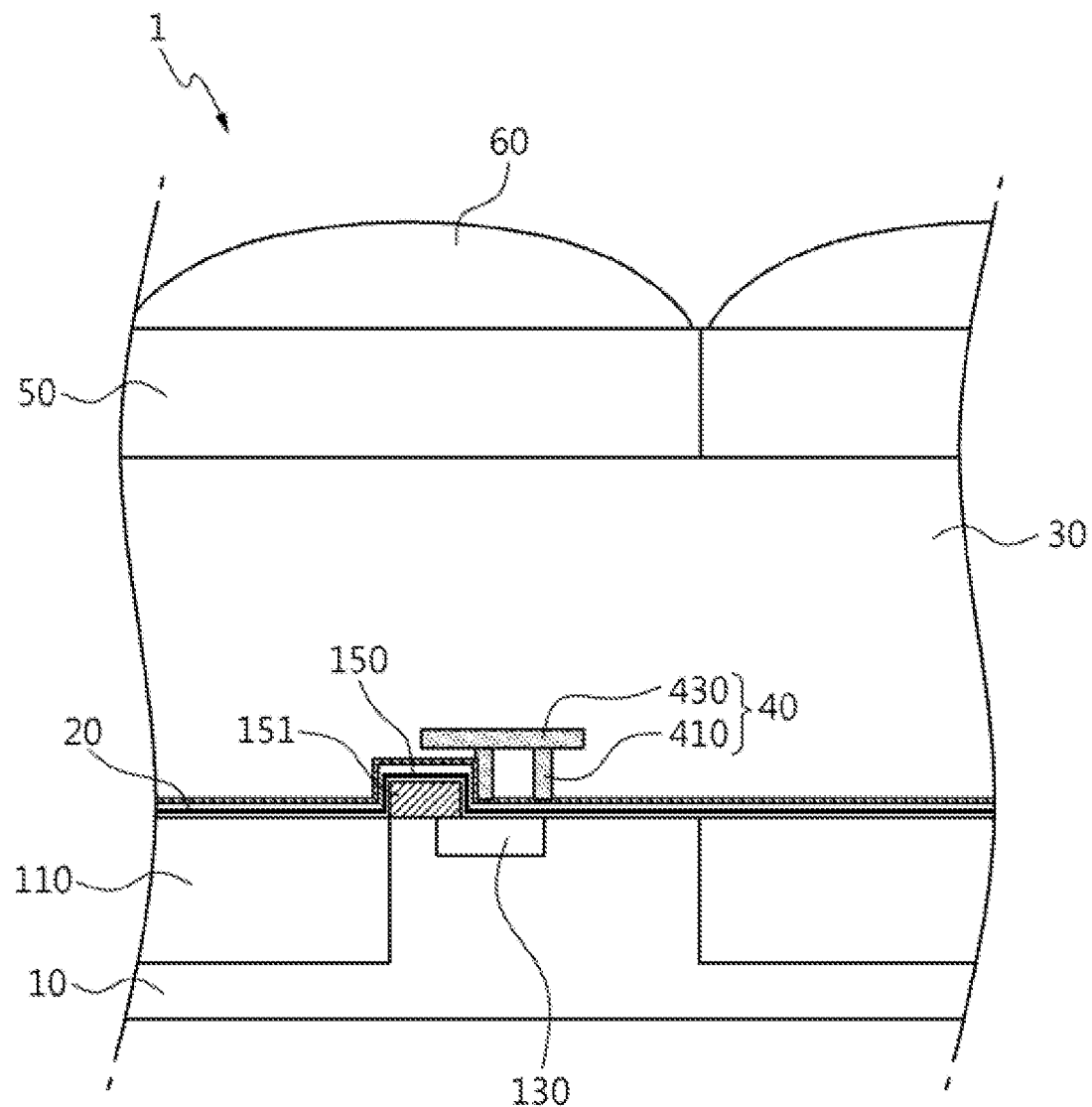
FIG. 2 is a cross-sectional view illustrating a unit pixel region of an image sensor including a shield according to one or more embodiments of the present invention.
Figure 3:
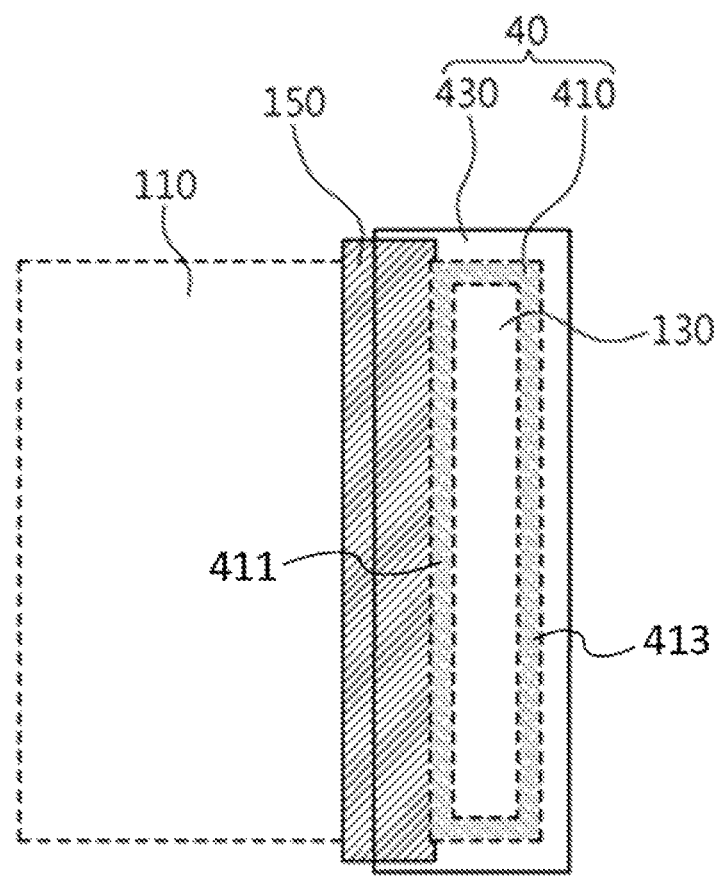
FIG. 3 is a plan view illustrating the shield according to FIG. 2.
Figure 4:
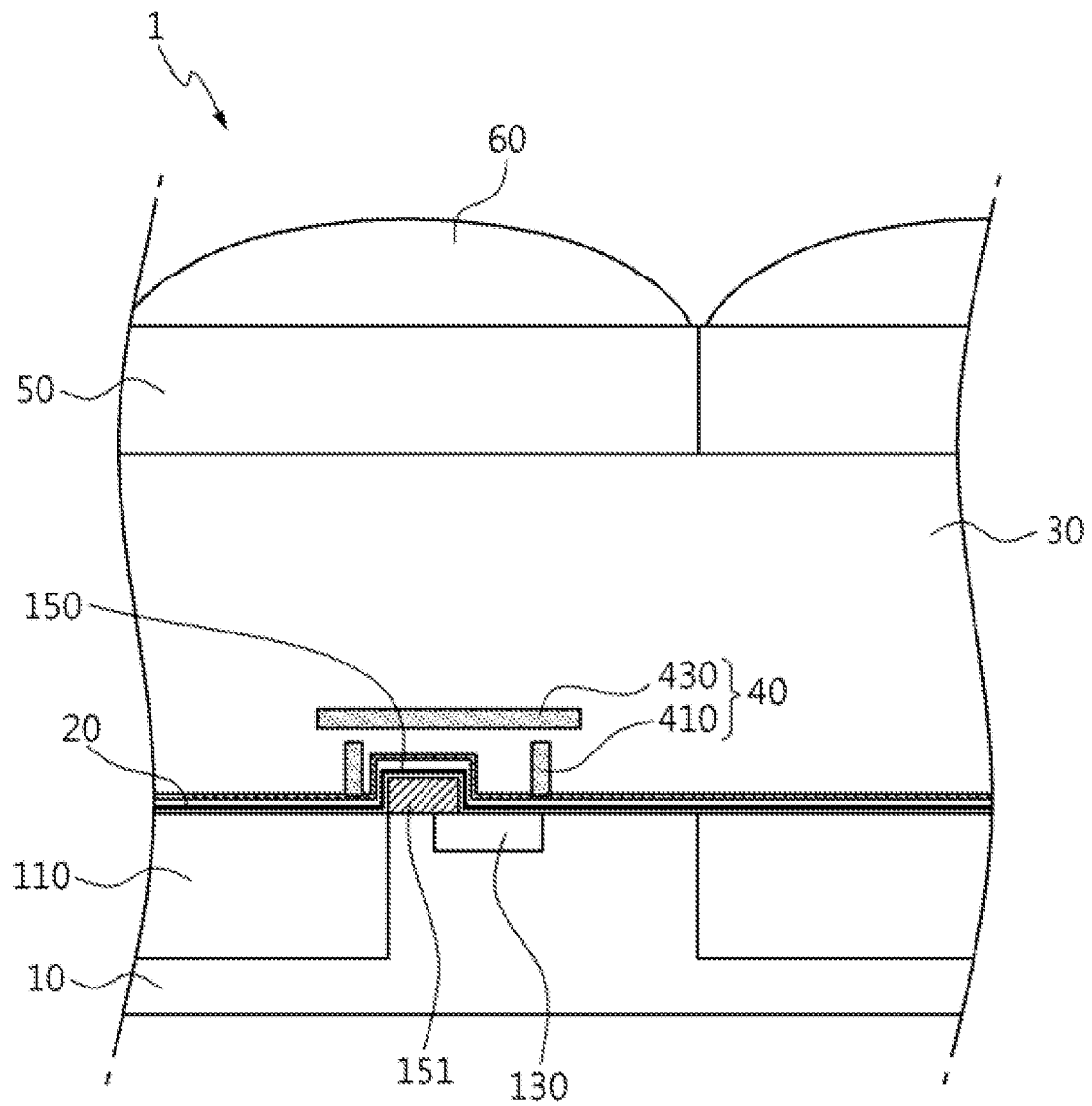
FIG. 4 is a cross-sectional view illustrating the unit pixel region in which an overlying layer is spaced apart from a side wall in the image sensor illustrated in FIG. 2.
Figure 5:
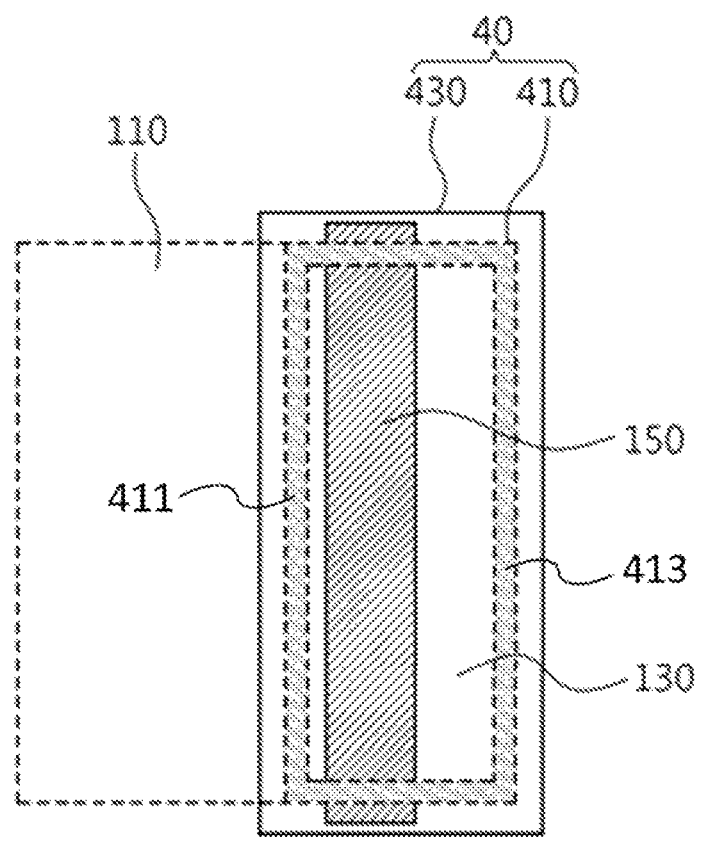
FIG. 5 is a plan view illustrating the shield according to FIG. 4.

FIG. 2 is a cross-sectional view illustrating a unit pixel region of an image sensor including a shield according to one or more embodiments of the present invention, FIG. 3 is a plan view illustrating the shield according to FIG. 2, FIG. 4 is a cross-sectional view illustrating the unit pixel region in which a overlying layer is spaced apart from a side wall in the image sensor illustrated in FIG. 2, and FIG. 5 is a plan view illustrating the shield according to FIG. 4.

Hereinafter, an image sensor 1 according to embodiments of the present invention will be described in detail with reference to the accompanying drawings.

Referring to FIG. 2, the present invention may relate to the image sensor 1. More particularly, the present invention encompasses the image sensor 1, including a shield 40 comprising, for example, a metal, above an electrical charge storage element 130 in a pixel region and configured to block incident light from the electrical charge storage element 130, thereby reducing or preventing reading a charge value including leakage charge introduced to the electrical charge storage element 130, and thus adversely affecting an image result. Here, the pixel region is a region that absorbs incident light from outside, and generally comprises of a plurality of unit pixel regions.

The image sensor 1 (or each unit pixel thereof) may include a semiconductor layer 10, an insulating layer 20, an upper insulating film 30, the shield 40, a color filter 50, and a lens 60.

In the image sensor 1 according to embodiments of the present invention, the structure of each unit pixel region will be described in detail. The semiconductor layer 10 is below the unit pixel region. The semiconductor layer 10 may comprise, for example, an epitaxial layer, and is a configuration commonly applied to each unit pixel region. The semiconductor layer 10 may be, for example, a low concentration P-type layer on a substrate (e.g., a silicon wafer). Furthermore, a device isolation layer (not illustrated) may be in the semiconductor layer 10 to define an active region, and the device isolation layer may be formed by, for example, a shallow trench isolation (STI) process.

In each unit pixel region, the semiconductor layer 10 may include a photoelectric transformation element 110 and the electrical charge storage element 130, and the photoelectric transformation element 110 and the electrical charge storage element 130 be spaced apart from each other. Here, the photoelectric transformation element 110 is configured to generate an electric charge in response to incident light, and may comprise any of a photodiode, a photo gate, a photo transistor, or the like, which are either now known or later developed in the future. However, the present invention is not limited thereto. The photoelectric transformation element 110 may be electrically connected to a transistor (which may not be fully illustrated in FIG. 2, but which may include the gate 150).

Furthermore, the electrical charge storage element 130 is configured to store the electrical charge accumulated in the photoelectric transformation element 110. The electrical charge storage element 130 may be, for example, a storage diode or a floating diffusion region. The electrical charge storage element 130 temporarily stores the electrical charge that is generated by the photoelectric transformation element 110 as a result of absorbing incident light. Thereafter, the image sensor may read out the electrical charge from the electrical charge storage element 130 using a separate floating diffusion region (which may not be illustrated and/or labelled in FIG. 2) in accordance with its readout timing. The photoelectric transformation element 110 and the electrical charge storage element 130 may have an uppermost surface that is coplanar with an uppermost surface of the semiconductor layer 10, but are not limited thereto. Furthermore, the electrical charge storage element 130 may be adjacent to the storage gate 150 which will be described later, or at a position partially overlapping with the storage gate 150.

The storage gate 150 is on one side of the semiconductor layer 10, preferably on the upper surface of the semiconductor layer 10. The storage gate 150 may have a lower surface that partially overlaps with the electrical charge storage element 130. When a control signal is applied to the storage gate 150, the storage gate 150 allows the electrical charge accumulated in the photoelectric transformation element 110 to be transferred to and/or stored in the electrical charge storage element 130. Furthermore, the storage gate 150 includes a gate electrode 151, and a gate insulating layer may be between the gate electrode 151 and the surface of the semiconductor layer 10. The gate insulating film may comprise a silicon oxide film, a high dielectric constant film, or a combination thereof, and may be formed by atomic layer deposition (ALD), chemical vapor deposition (CVD), or physical vapor deposition (PVD), without being limited thereto.

The insulating layer 20 is along the upper surface of the semiconductor layer 10, and the insulating layer 20 serves as a protective layer configured to protect the semiconductor layer 10. The insulating layer 20 is between the semiconductor layer 10 and the shield 40 which will be described later, to provide electrical insulation between the semiconductor layer 10 and the shield 40. The insulating layer 20 may comprise, for example, a multilayer film, and may comprise, for example, a stacked film including an oxide film and a nitride film. Alternatively, the stacked film may comprise an oxide film, a nitride film, and an oxynitride film. The insulating layer 20 comprising a multilayer film as above makes it possible to more reliably maintain an electrically insulated state between the semiconductor layer 110 and the shield 40. Furthermore, the insulating layer 20 extends along the outer surfaces of the storage gate 150.

The upper insulating film 30 is on the insulating layer 20. The upper insulating film 30 may be or comprise a passivation layer configured to protect the semiconductor layer 10, and may electrically insulate or physically separate the semiconductor layer 10 from the color filter 50, for example. Furthermore, the upper insulating film 30 may comprise a multilayer film in which materials having different refractive indices are sequentially stacked on top of each other to prevent light scattering and/or reflection. The upper insulating film 30 may comprise an insulating film typically used in an intermetal dielectric (IMD) film, and may comprise, for example, a spin-on glass (SOG) film, an undoped silicate glass (USG) film, a tetraethyl orthosilicate (TEOS) film, or the like.

Furthermore, the shield 40 is on the upper insulating film 30. Prior to describing the shield 40 according to embodiments of the present invention, a detailed description of an operation method and a problem in a general global shutter image sensor will be given.

Figure 1:
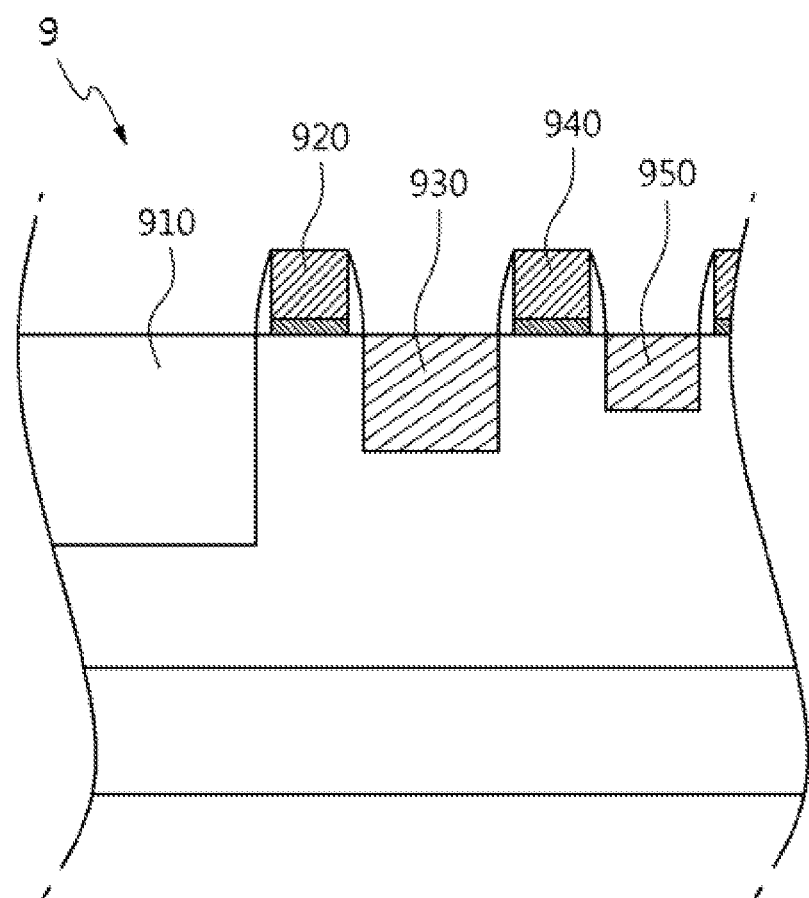
FIG. 1 is a cross-sectional view illustrating a unit pixel region of an image sensor in the related art.

Referring to FIG. 1, when an exposure of a photodiode 910 is first started, the photodiode 910 converts incident light into an electrical charge and accumulates the electrical charge. Thereafter, a first gate 920 is turned on in response to a first control signal, and the electrical charge accumulated in the photodiode 910 is transferred to a first floating diffusion region 930 and is temporarily stored. The first control signal is turned off thereafter, and after a predetermined time elapses, a second gate 940 is turned on in response to a second control signal, and the electrical charge stored in the first floating diffusion region 930 is transferred to a second floating diffusion region 950. The electrical charge stored in the first floating diffusion region 930 is then read out from the second floating diffusion region 950.

In a process in which light is incident on the photodiode 910, leakage charge may be unintentionally introduced to the first floating diffusion region 930 due to diffraction and diffuse reflection of the incident light elsewhere (e.g., in the unit pixel). Furthermore, the amount of light introduced to the first floating diffusion region 930 for each unit pixel increases substantially in proportion to the readout time. Therefore, the amount of leakage charge introduced to the first floating diffusion region 930 increases as the readout time increases. Furthermore, when a readout operation is performed, a total charge value including the leakage charge introduced to the first floating diffusion region 930 is transferred to the second floating diffusion region 950. This may adversely affect the parasitic light sensitivity (PLS) characteristic of the global shutter image sensor due to unintentional light information reception and readout.

To solve the above-described problem, referring to FIGS. 2 and 3, the image sensor 1 according to embodiments of the present invention is characterized in that the shield 40 is on and/or in the upper insulating film 30 to prevent unintentional light information from impinging upon the electrical charge storage element 130. The shield 40 may comprise, for example, a metal that does not transmit light, such as tungsten (W), without being limited thereto.

Furthermore, when the shield 40 is over the semiconductor layer 10 and/or the storage gate 150 to block incident light, dark current due to thermal causes or poor insulation can occur. The shield 40 according to embodiments of the present invention is configured such that the overlying layer 430 which will be described later is spaced apart from the semiconductor layer 10 and/or the storage gate 150 by a predetermined distance so as to prevent being in contact with the semiconductor layer 10 and/or the storage gate 150. The shield 40 may be configured to include, for example, a substantially horizontal extension and a vertical extension to block incident light from the electrical charge storage element 130.

To this end, the shield 40 may include the side walls 410 and the overlying layer 430.

The side walls 410 are configured to extend vertically and/or have a predetermined height in the upper insulating film 30 above the electrical charge storage element 130, for example, along or adjacent to an upper perimeter of the electrical charge storage element 130. That is, the side walls 410 surround an area above the electrical charge storage element 130. Furthermore, the side walls 410 may extend substantially vertically, or may be inclined in a specific direction, but are not limited thereto. Referring to FIGS. 2 and 3, the side walls 410 may be configured such a lower surface thereof is in contact with the upper surface of the semiconductor layer 10 or the insulating layer 20. Alternatively, referring to FIGS. 4 and 5, the lower surface of the side walls 410 may be at a height spaced apart from the insulating layer 20, but are not limited thereto. Furthermore, the side walls 410 may extend vertically at a position adjacent to the entire perimeter of the electrical charge storage element 130, and may have a cross-sectional shape such as, for example, a polygon, or more specifically, a quadrangle. However, these are only examples, and the side walls 410 may have an arbitrary shape suitable for blocking incident light from the electrical charge storage element 130.

The side walls 410 configured as described above makes it possible to prevent the overlying layer 430, which will be described later, from being in contact with the semiconductor layer 10 and the storage gate 150, while blocking incident light from a lateral direction. That is, when only the overlying layer 430 is above the electrical charge storage element 130, the entire area below the overlying layer 430 is open, and thus it is impossible to completely block incident light that might otherwise impinge upon the electrical charge storage element 130. For example, there is a possibility that incident light is diffracted or reflected by a metal wiring layer (not illustrated) or the like at a side adjacent to the electrical charge storage element 130 and may enter the area below the overlying layer 430. Therefore, by providing the side walls 410 below the overlying layer 430, the image sensor 1 according to the present invention can prevent the above problem.

According to one or more embodiments, within the unit pixel region, a first side wall 411 extends along the outer vertical surface of the storage gate 150 adjacent to the electrical charge storage element 130, and a second side wall 413 opposite from the first side wall 411 extends along or adjacent to the boundary of the electrical charge storage element 130 distal or remote from the storage gate 150 (see FIG. 2). Remaining side walls extend orthogonally to the first and second side walls to connect the first side wall 411 and the second side wall 413 (or ends thereof) to each other. Furthermore, the first side wall 411 may be in close contact with the outer surface of the storage gate 150 or may be spaced apart therefrom by a predetermined distance (e.g., the thickness of the insulation layer 20 along the vertical surface of the gate electrode 151), but is not limited thereto.

Herein, the "first direction" refers to a forward-rearward direction (e.g., above and below the plane of the page) in the drawings, and the "second direction" refers to a leftward-rightward direction (e.g., in the plane of the page in the drawings). That is, the first side wall 411 according to some embodiments is above the electrical charge storage element 130 (FIG. 2) or the storage gate 150 (FIG. 4).

Figure 6:
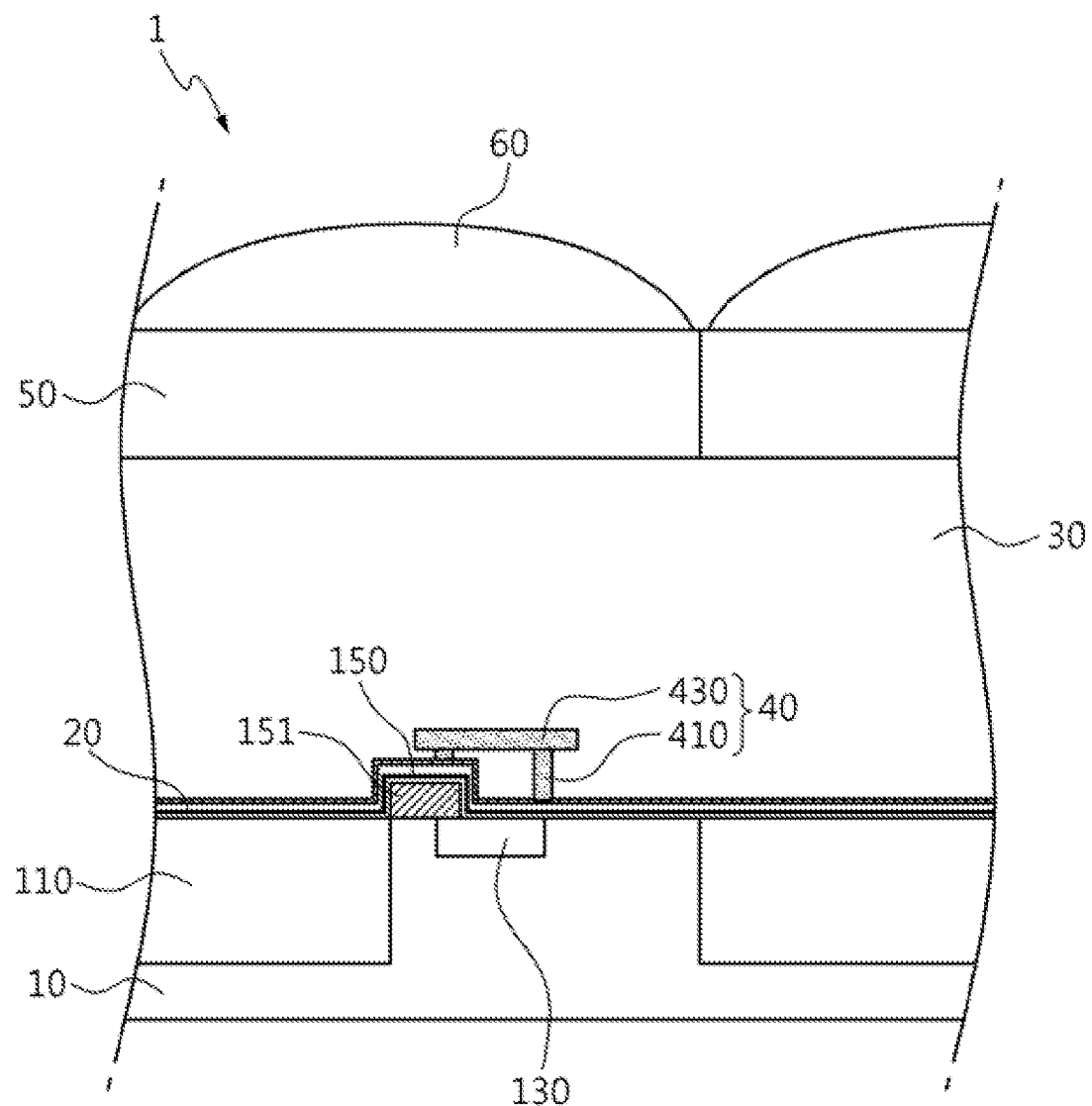
FIG. 6 is a cross-sectional view illustrating a unit pixel region of an image sensor including a shield according to one or more other embodiments of the present invention.
Figure 7:
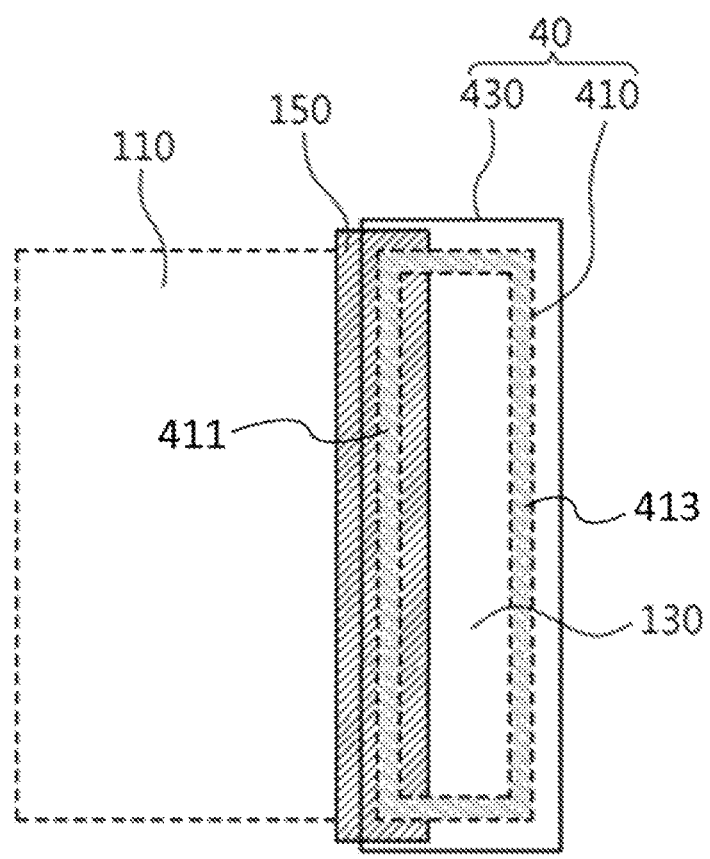
FIG. 7 is a plan view illustrating the shield according to FIG. 6.

FIG. 6 is a cross-sectional view illustrating a unit pixel region of an image sensor including a shield according to other embodiments of the present invention, and FIG. 7 is a plan view illustrating the shield according to FIG. 6.

According to other embodiments, within the unit pixel region, a first side wall 411 may extend along the storage gate 150, and a second side wall 413 may extend along the boundary of the electrical charge storage element 130, or along a position adjacent to the boundary (see FIGS. 6 and 7). This can facilitate formation of the first side wall 411 when the storage gate 150 partially overlaps with the electrical charge storage element 130.

Figure 8:
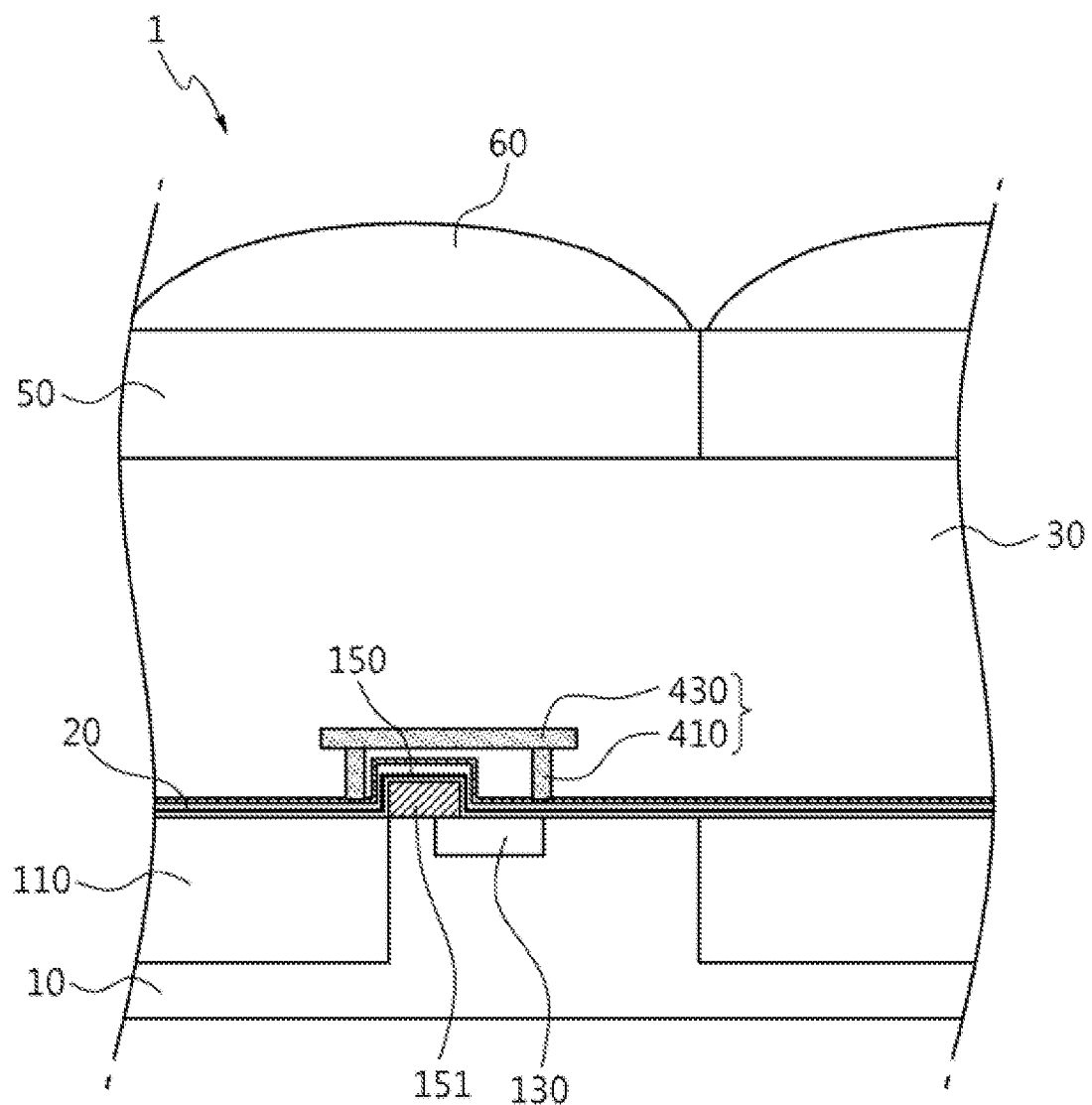
FIG. 8 is a cross-sectional view illustrating a unit pixel region of an image sensor including a shield according to one or more other embodiments of the present invention.
Figure 9:
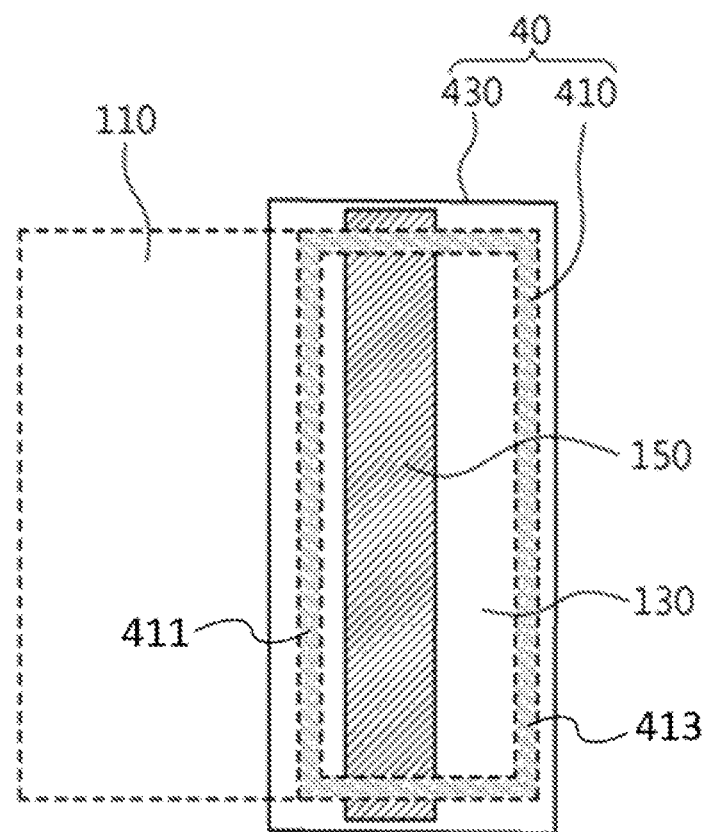
FIG. 9 is a plan view illustrating the shield according to FIG. 8.

FIG. 8 is a cross-sectional view illustrating a unit pixel region of an image sensor including a shield according to one or more other embodiments of the present invention, and FIG. 9 is a plan view illustrating the shield according to FIG. 8.

According to other embodiments, within the unit pixel region, a first side wall 411 may extend along an outer vertical surface of a storage gate 150 distal or remote from the electrical charge storage element 130 (see FIGS. 8 and 9). In more detail, the first side wall 411 extends along a position a predetermined distance from the outer vertical surface of the storage gate 150 distal or remote from the electrical charge storage element 130. Furthermore, a second side wall 413 may extend along the boundary of the electrical charge storage element 130 or a position adjacent to the boundary. Side walls 410 configured as above surround the storage gate 150 as well as the area above the electrical charge storage element 130. That is, there arises an advantage that light incident toward the storage gate 150 can be prevented from being introduced to the electrical charge storage element 130 through the storage gate 150.

Referring to FIGS. 2 to 9, the overlying layer 430 is configured to completely cover the side walls 410 and block light incident from thereabove. For example, the overlying layer 430 may extend substantially horizontally. The overlying layer 430 may be in contact with an uppermost end of the side walls 410 to cover the side walls 410. Alternatively, the overlying layer 430 may be spaced apart from the uppermost end of the side walls 410 by a predetermined distance. Furthermore, the overlying layer 430 may be configured such that ends thereof extend outwardly farther than outermost edges of the uppermost surface of the side walls 410. However, the ends of the overlying layer 430 may overlap with the uppermost surface of the side walls 410, but are not limited thereto. However, when forming the overlying layer 430 and the ends of the overlying layer 430 overlap with the uppermost surface of the side walls 410, a gap between the side walls 410 and the overlying layer 430 due to a process error can arise. Accordingly, the ends of the overlying layer 430 preferably extend outwardly farther than the outermost edges or surfaces of the side walls 410.

Referring to FIG. 2, the color filter 50 is on the upper insulating film 30 in the pixel region and filters the light passing through the lens 60, which will be described later, such that only a particular color or wavelength band of light passes through (e.g., is selected by) the corresponding color filters R, G, and B of the color filter 50. The selected color of light is then incident on the photoelectric transformation element 110 of the corresponding pixel.

The lens 60 is on the color filter 50 and comprises a micro lens that focuses incident light on the photoelectric transformation element 110 in the corresponding pixel.

Figure 10:
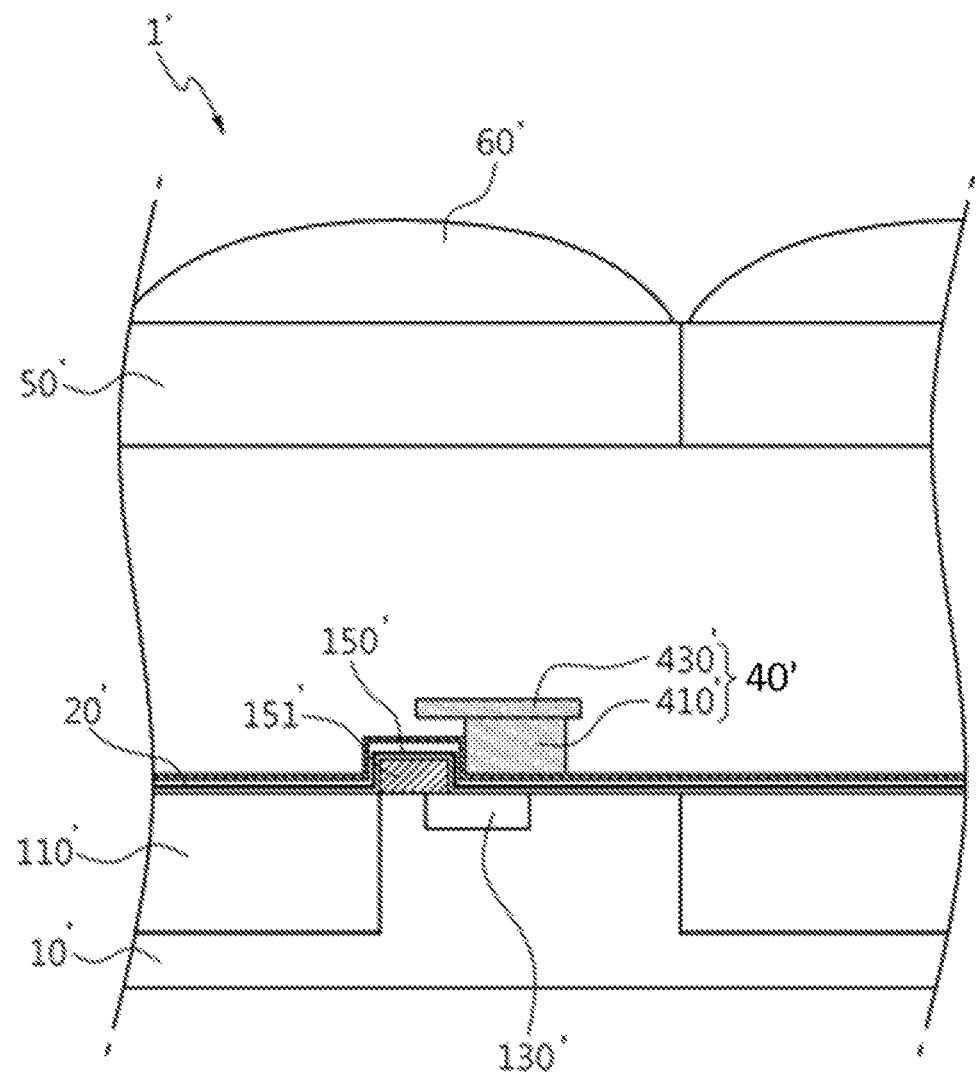
FIG. 10 is a cross-sectional view illustrating a unit pixel region of an image sensor including a shield according to one or more other embodiments of the present invention.
Figure 11:
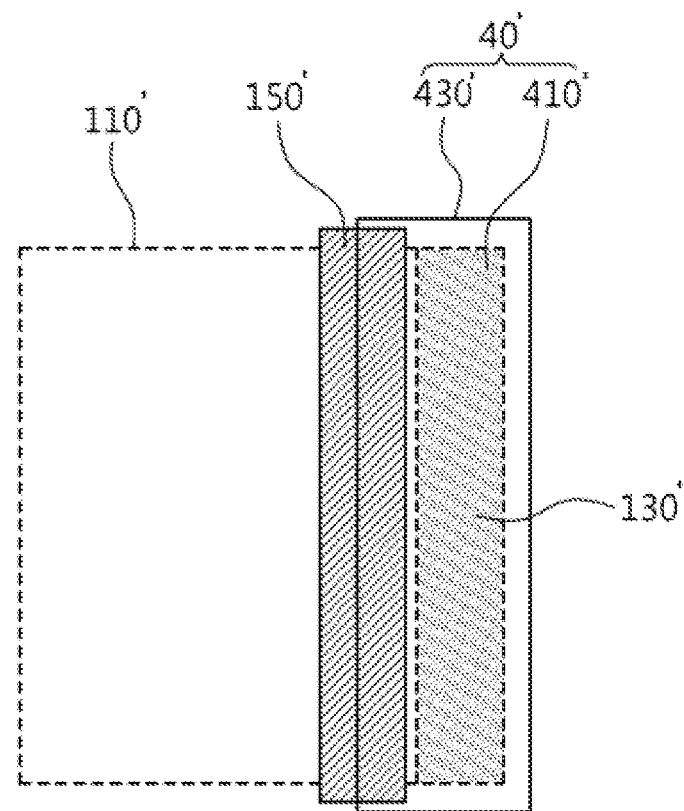
FIG. 11 is a plan view illustrating the shield according to FIG. 10.

FIG. 10 is a cross-sectional view illustrating a unit pixel region of an image sensor including a shield according to other embodiments of the present invention, and FIG. 11 is a plan view illustrating the shield according to FIG. 10.

Hereinafter, an image sensor 1' according to other embodiments of the present invention will be described with reference to the accompanying drawings. Since the image sensor 1' according to other embodiments of the present invention differs from the above-described image sensor 1 only in the structure of the shields 40 and 40', a description of duplicate contents thereof will be omitted.

Referring to FIGS. 10 and 11, the shield 40' of the image sensor 1' according to other embodiments of may include a wall structure 410' and an overlying layer 430'. Since the overlying layer 430' has the same configuration as the overlying layer 430 described above, a detailed description thereof will be omitted.

The wall structure 410' covers the entire upper surface of an electrical charge storage element 130'. That is, this is a configuration in which the entire polygon is filled. Here, the "upper surface" of the electrical charge storage element 130' denotes an upper surface of the electrical charge storage element 130' that does not overlap with the storage gate 150'. As such, when the wall structure 410' is used instead of the side walls 410, the manufacturing process may be simplified. That is, when forming the side walls 410, for example, a quadrangular-shaped hole or trench outline is formed, whereas when forming the wall structure 410', for example, a completely empty quadrangular-shaped hole or trench is formed. Furthermore, when forming the side walls 410, the hole or trench has a relatively narrow width, whereas when forming the wall structure 410', formation of a relatively wide hole, which is relatively easy to do, provides a process advantage.

When the wall structure 410' configured as above is formed, provision of the overlying layer 430' may be eliminated. However, when forming the overlying layer 430', for example, to partially or totally cover the area above the storage gate 150', it is possible to partially or totally block a travel route of light that may otherwise impinge upon the electrical charge storage element 130'.

FIGS. 12 to 17 are schematic views illustrating an exemplary method of manufacturing an image sensor according to embodiments of the present invention.

Hereinafter, the exemplary method of manufacturing the image sensor will be described in detail with reference to the accompanying drawings.

Figure 12:
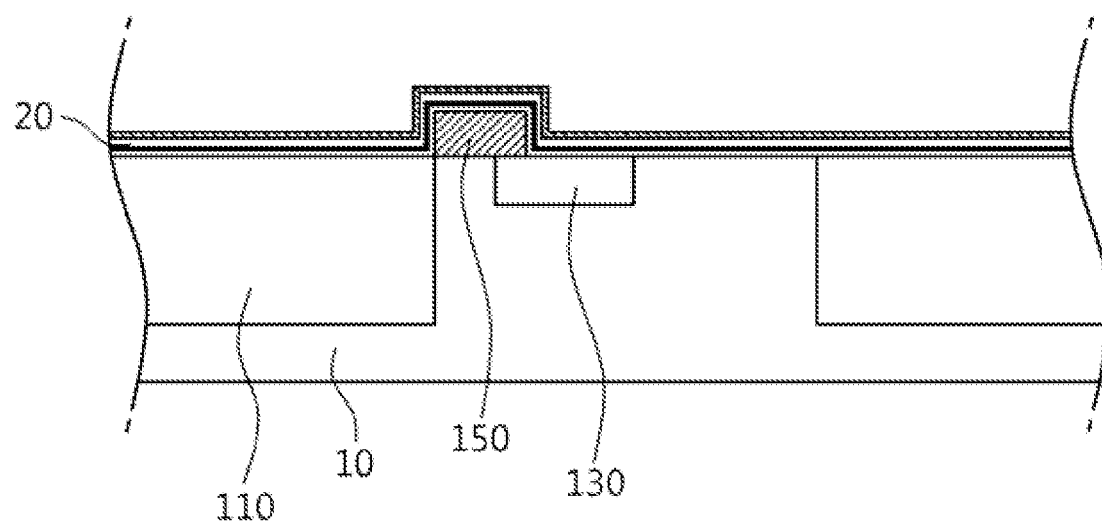
FIGS. 12 to 17 are schematic views illustrating a method of manufacturing an image sensor according to one or more embodiments of the present invention.

Referring to FIG. 12, first, a photoelectric transformation element 110 and an electrical charge storage element 130 are formed in a semiconductor layer 10 in a pixel region. Thereafter, a storage gate 150 is formed on the semiconductor layer 10. These configurations may be formed through a conventional general process, but are not limited thereto.

An insulating layer 20 is then deposited along an upper surface of the semiconductor layer 10 and an outer surface of the storage gate 150. As described above, the insulating layer 20 may comprise a multilayer film including an oxide film and a nitride film, and an oxynitride film may be added.

Figure 13:
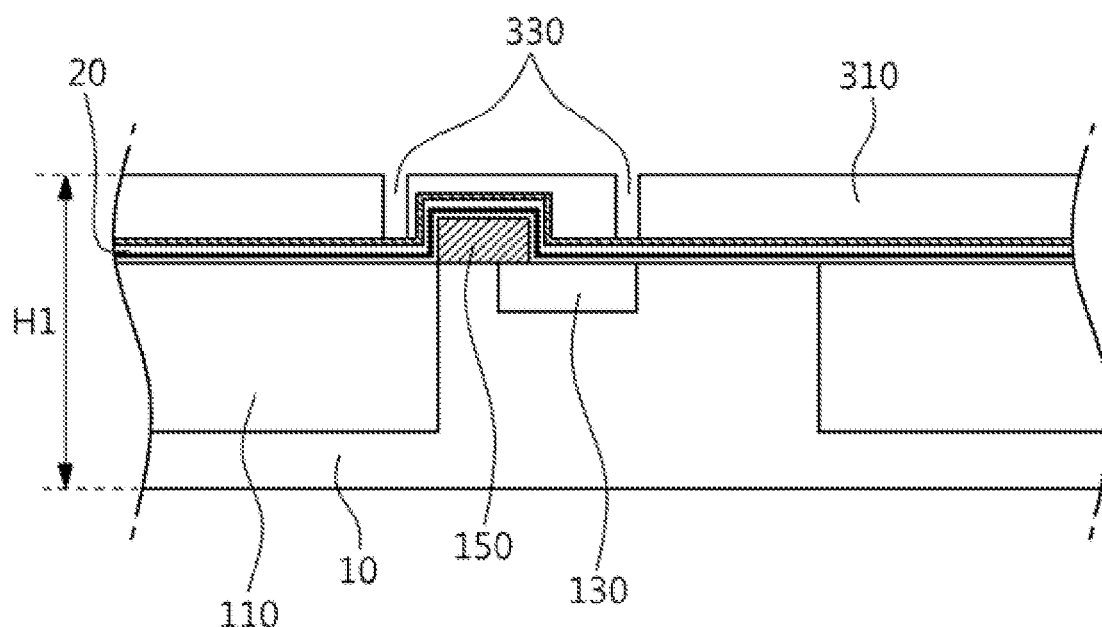

Referring to FIG. 13, a first insulating film 310 is deposited on the insulating layer 20 to a first height H1. Thereafter, a hole or trench 330 is formed in the first insulating film 310. The hole or trench 330 may have, for example, a quadrangular shape and be formed by an etching process using a photoresist pattern formed on the first insulating film 310 as a mask. Alternatively, when a wall structure 410' is formed, for example, all of the first insulating film 310 within the outermost border of the hole or trench 330 is removed.

Figure 14:
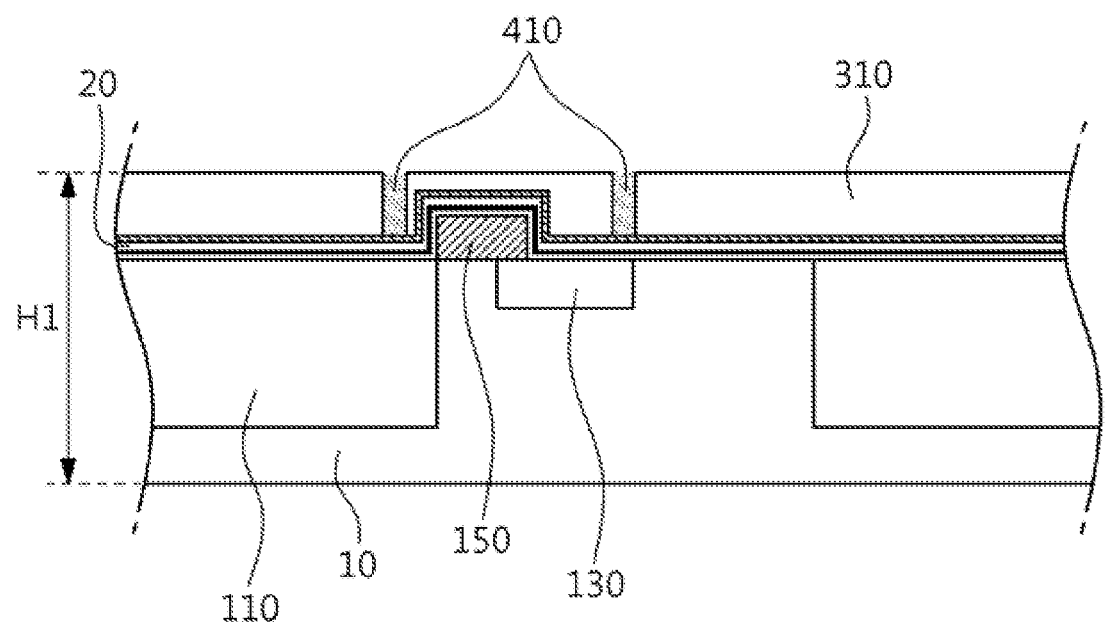
Figure 15:
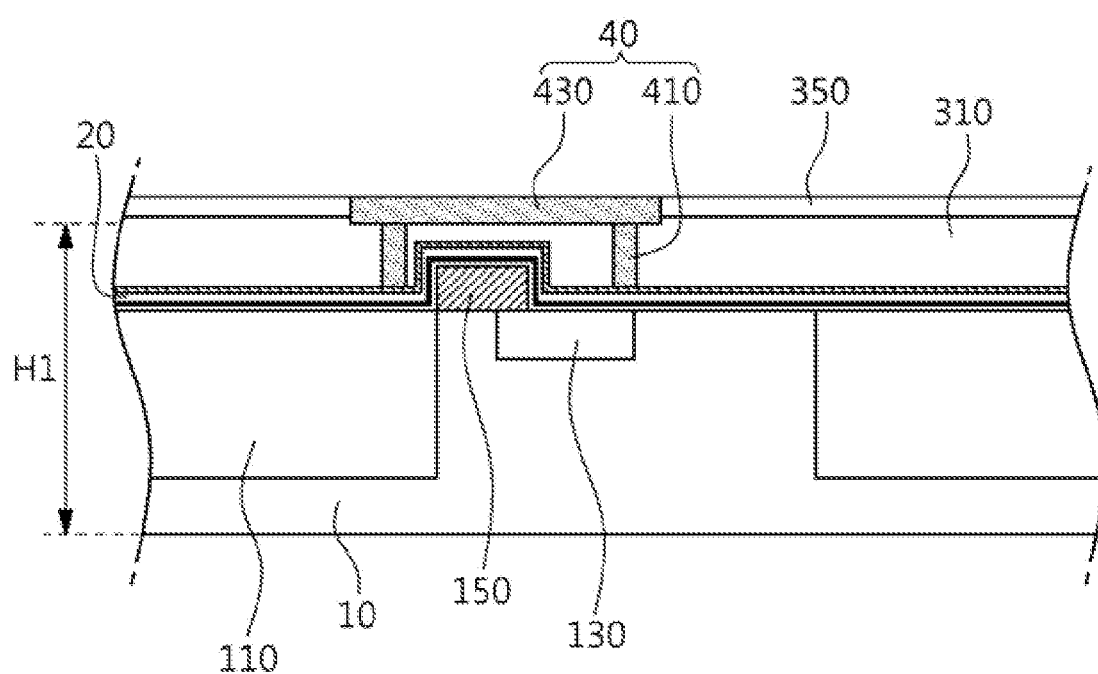

Referring to FIG. 14, side walls 410 or the wall structure 410' is then formed by conventionally filling the hole or trench 330 with a metal, such as tungsten or aluminum, either of which may further comprise a Ti and/or TiN liner. Referring to FIG. 15, a sacrificial layer 350 is deposited on the first insulating film 310. The sacrificial layer 330 may comprise, for example, a conventional TEOS layer and may have a thickness equal to or less than that of the overlying layer 430. Thereafter, using a photoresist pattern conventionally formed on the sacrificial layer 350 as a mask, a trench or opening is etched in the sacrificial layer 350 in which the overlying layer 430 is to be formed. The overlying layer 430 may then be formed by filling the etched part of the sacrificial layer 350 with a metal, similarly or identically to the side walls portion 410 or the well wall structure portion 410'. The overlying layer 430 may be in close contact with an upper portion (e.g., in contact with an uppermost surface) of the side walls 410 or the wall structure 410', for example, in accordance with the etched thickness of the sacrificial layer 350. That is, the sacrificial layer 350 corresponding to a position or location where the overlying layer 430 is to be formed may be etched to a depth equal to, less than, or slightly greater than the thickness of the sacrificial layer 350. Then, after forming the overlying layer 430, a second insulating film 330 is deposited on the first insulating film 310, the overlying layer 430, and any remaining portion(s) of the sacrificial layer 350 to a second height H2. Here, the second height H2 denotes a position higher than or a height greater than the first height H1.

Figure 16:
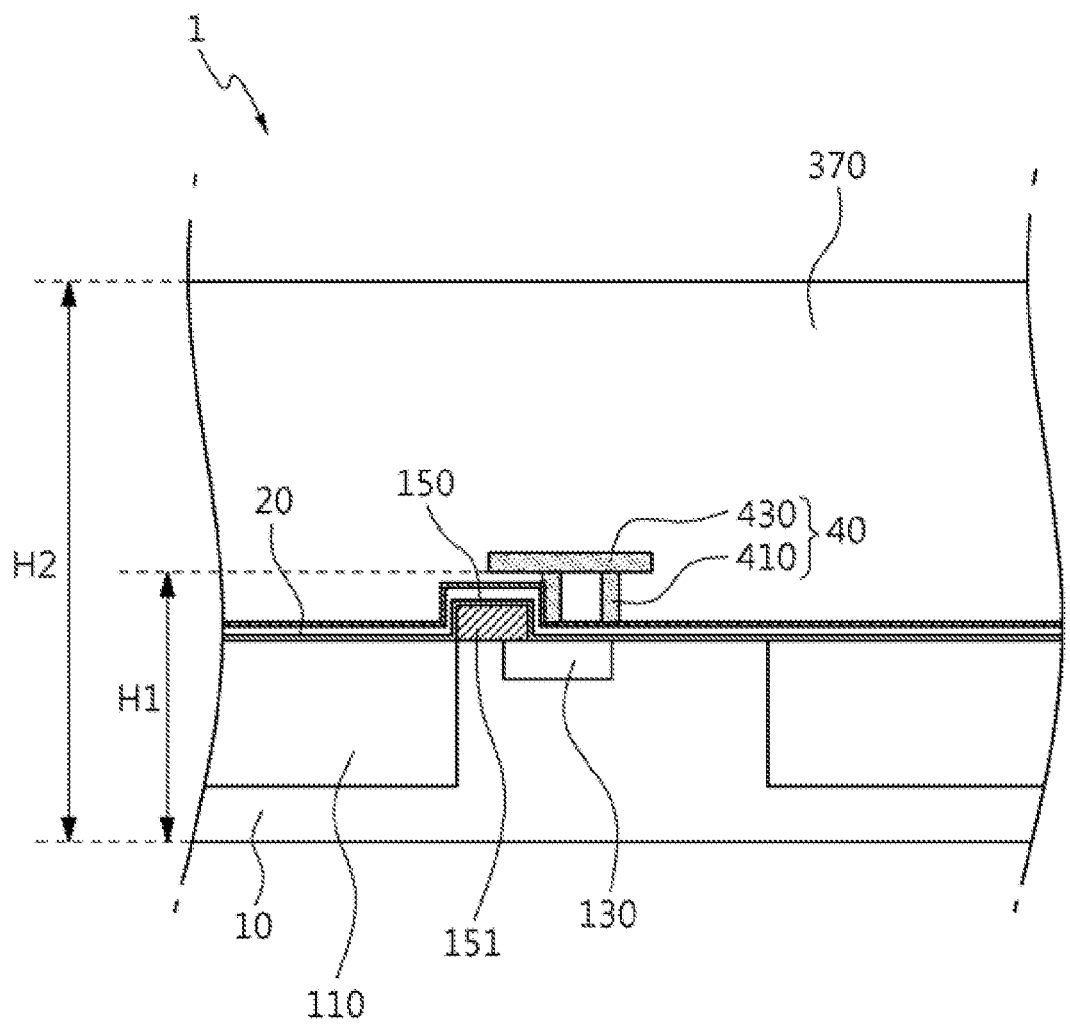

Alternatively, a metal may be directly formed or deposited on the first insulating film 310, and then the metal may be patterned and etched to form the overlying layer 430, followed by deposition of the second insulating film 330 on the first insulating film 310 (see FIG. 16). In this case, the lowermost surface of the overlying layer 430 necessarily contacts the uppermost surface of the side walls 410 or the wall structure 410'.

Furthermore, prior to forming the second insulating film 330, the overlying layer 430 may be planarized by CMP, especially when forming the overlying layer 430 by filling a trench or opening in the sacrificial layer 350.

Figure 17:
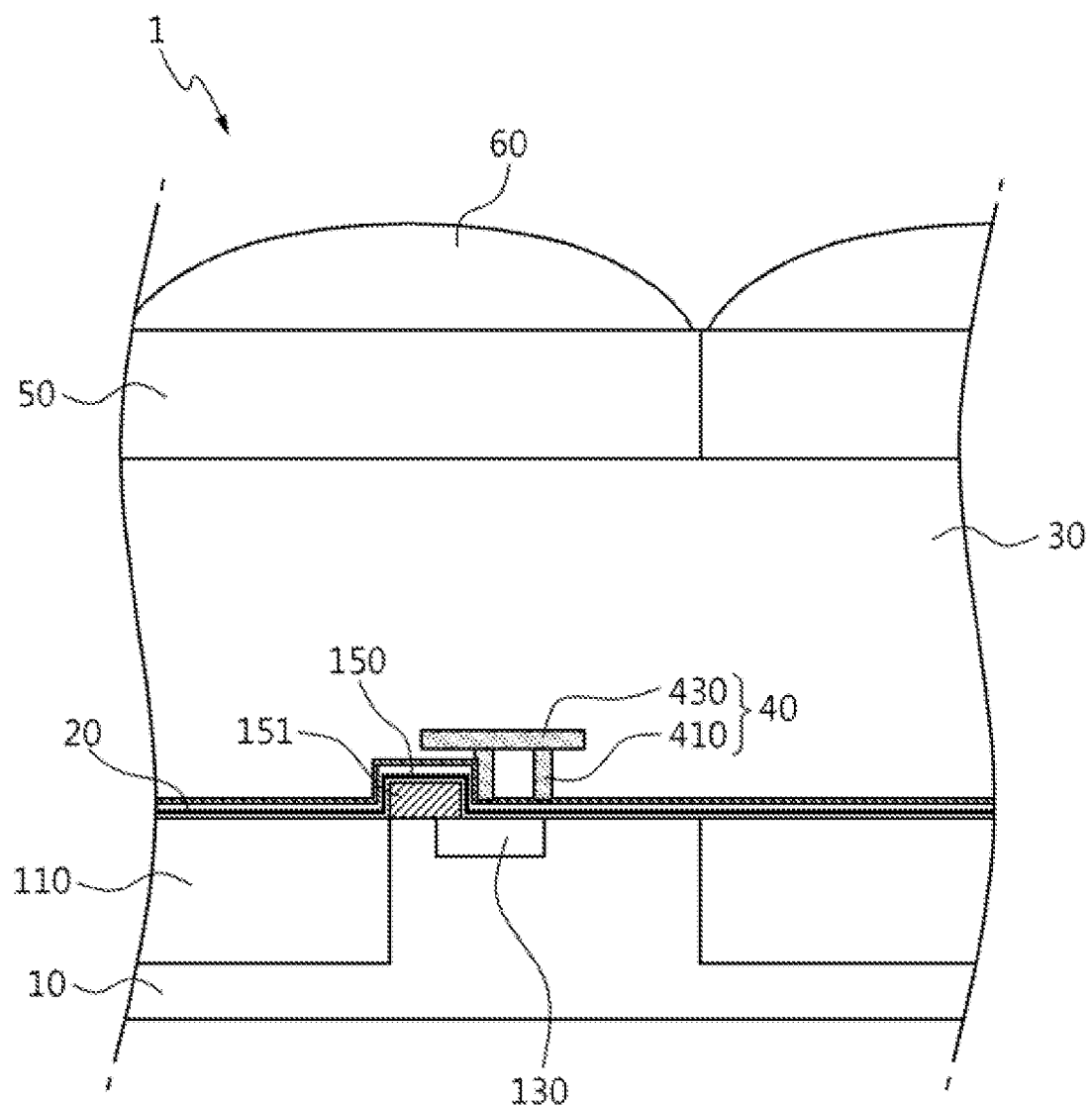

Referring to FIG. 17, a color filter 50 and a lens 60 are then sequentially formed on the upper insulating film 30 in the pixel region by conventional processes. After formation of the color filter 50, and before formation of the lens 60, a planarization layer (not illustrated) may be formed on the color filter 50. Furthermore, after formation of the lens 60, a separate process for removing surface residues may be performed.

The foregoing description of the invention illustrates and describes the present invention. Additionally, the disclosure shows and describes only exemplary embodiments of the invention. As mentioned above, the invention is capable of use in various other combinations, modifications, and environments. That is, the present invention is capable of changes or modifications within the scope of the inventive concept as expressed herein, commensurate with the above teachings and/or the skill or knowledge of the relevant art(s). The embodiments described herein above are further intended to explain best modes known of practicing the invention and to enable others skilled in the art to utilize the invention in such, or other, embodiments and with various modifications for particular applications or uses of the invention. Accordingly, the description is not intended to limit the invention to the form(s) disclosed herein.

What is claimed is:

1. An image sensor, comprising:
a semiconductor layer including a photoelectric transformation element and an electrical charge storage element therein;
a storage gate on the semiconductor layer;
an upper insulating film on the semiconductor layer;
a color filter on the upper insulating film in a pixel region;
a lens on the color filter, focusing incident light on the photoelectric transformation element in a corresponding pixel; and
a shield at least partially in the upper insulating film and above the electrical charge storage element, configured to block light that might otherwise impinge upon the electrical charge storage element or an area above the electrical charge storage element, wherein:
the shield comprises one or more side walls extending vertically from the semiconductor layer above the electrical charge storage element, and an overlying layer above the one or more side walls configured to block incident light and comprising a metal, and
the overlying layer extends substantially horizontally in a plane above an uppermost end of the one or more side walls and is in contact with the uppermost end of the one or more side walls to cover an uppermost surface of the one or more side walls, and extends outwardly farther than outermost portions of the uppermost surface of the one or more side walls.

2. The image sensor of claim 1, wherein the side wall(s) surrounds an upper surface of the electrical charge storage element or an area above the upper surface of the electrical charge storage element.

3. The image sensor of claim 2, wherein the side wall(s) has a substantially polygonal shape.

4. An image sensor, comprising:
a semiconductor layer including a photoelectric transformation element and an electrical charge storage element therein;
a storage gate on the semiconductor layer;
an insulating layer on an upper surface of the semiconductor layer;
an upper insulating film on the insulating layer;
a color filter on the upper insulating film in a pixel region;
a lens on the color filter, focusing incident light on the photoelectric transformation element in a corresponding pixel; and
a shield including a substantially vertical extension and a substantially horizontal extension at least partially in the upper insulating film, configured to block light that might otherwise impinge upon the electrical charge storage element or an area above the electrical charge storage element, wherein:
the shield comprises one or more side walls extending vertically from the semiconductor layer above the electrical charge storage element, and an overlying layer above the one or more side walls configured to block incident light and comprising a metal, and
the overlying layer extends substantially horizontally at a position spaced upwardly from an uppermost end of the one or more side walls.

5. The image sensor of claim 4, wherein the insulating layer comprises a multilayer film including an oxide film, a nitride film, and optionally an oxynitride film.

6. The image sensor of claim 4, wherein the side wall(s) comprise:

a first side wall extending along or adjacent to an outer vertical surface of the storage gate adjacent to the electrical charge storage element; and a second side wall extending upwardly along or adjacent to a boundary of the electrical charge storage element distal or remote from the storage gate.

7. The image sensor of claim 4, wherein the side wall(s) comprise:

a first side wall extending above and along the storage gate; and a second side wall extending along or adjacent to a boundary of the electrical charge storage element distal or remote from the storage gate.

8. The image sensor of claim 4, wherein the shield covers both the electrical charge storage element and the storage gate.

9. The image sensor of claim 8, wherein the side wall(s) comprise:

a first side wall extending along a position adjacent to an outer vertical surface of the storage gate distal or remote from the electrical charge storage element; and a second side wall extending upwardly along or adjacent to a boundary of the electrical charge storage element distal or remote from the storage gate.

10. A method of manufacturing an image sensor, the method comprising:

forming a photoelectric transformation element and an electrical charge storage element in a semiconductor layer;

forming a storage gate on the semiconductor layer;

depositing an insulating layer on an upper surface of the semiconductor layer and an outer surface of the storage gate;

depositing a first insulating film on the insulating layer to a first height;

forming a hole or trench in the first insulating film;

forming one or more side walls by filling the hole or trench with a metal;

forming an overlying layer comprising a metal on the first insulating film and the one or more side walls; and depositing a second insulating film on the first insulating film and the overlying layer to a second height, wherein the one or more side walls extend vertically from the semiconductor layer, above the electrical charge storage element and the overlying layer is configured to block incident light and is in contact with an uppermost end of the one or more side walls to cover an uppermost surface of the one or more side walls and extends outwardly farther than outermost portions of the uppermost surface of the one or more side walls.

11. The method of claim 10, wherein forming the overlying layer comprises:

depositing a sacrificial layer on the first insulating film after forming the one or more side walls;

etching an exposed part of the sacrificial layer, the exposed part corresponding to a location of the overlying layer; and filling an etched part of the sacrificial layer with the metal.

12. The method of claim 11, wherein forming the overlying layer comprises etching the exposed part of sacrificial layer to a depth less than a thickness of the sacrificial layer, thereby forming an overlying layer that is not in contact with the one or more side walls located therebelow.

13. The method of claim 10, wherein forming the overlying layer comprises forming the metal on the first insulating film and then etching the metal.

* * * * *